(12) United States Patent
Cao et al.

(10) Patent No.: US 6,387,736 B1
(45) Date of Patent: *May 14, 2002

(54) METHOD AND STRUCTURE FOR BONDING LAYERS IN A SEMICONDUCTOR DEVICE

(75) Inventors: Min Cao; Jeremy A Theil; Gary W Ray, all of Mountain View; Dietrich W Vook, Menlo Park, all of CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,687

(22) Filed: Apr. 26, 1999

(51) Int. Cl.$^7$ ................................................ H01L 21/00
(52) U.S. Cl. .......................................... 438/149; 438/96
(58) Field of Search .......................... 438/44, 479, 654, 438/42, 149, 96

(56) References Cited

U.S. PATENT DOCUMENTS

| 4,404,235 A | * | 9/1983 | Tarng et al. ................. 438/654 |
| 4,419,696 A | | 12/1983 | Hamano et al. ............. 358/294 |
| 5,084,399 A | * | 1/1992 | Tei .............................. 438/73 |
| 5,362,672 A | * | 11/1994 | Ohmi et al. ................. 117/108 |
| 5,488,012 A | * | 1/1996 | McCarthy ................... 438/479 |
| 5,707,894 A | | 1/1998 | Hsiao .......................... 437/209 |
| 5,734,200 A | | 3/1998 | Hsue et al. .................. 257/755 |
| 5,739,046 A | | 4/1998 | Lur et al. .................... 437/190 |
| 5,783,487 A | | 7/1998 | Weeks et al. ............... 438/685 |
| 5,858,873 A | | 1/1999 | Vitkavage et al. .......... 438/626 |
| 6,010,956 A | * | 1/2000 | Takiguchi et al. .......... 438/623 |
| 6,121,077 A | * | 9/2000 | Hu et al. .................... 438/164 |

FOREIGN PATENT DOCUMENTS

JP     59.158569     9/1984     ........... H01L/29/91

OTHER PUBLICATIONS

Annex to the European Search Report on European Patent Application No. EP 0 030 3451.

* cited by examiner

*Primary Examiner*—Carl Whitehead. Jr.
*Assistant Examiner*—Jeff Vockrodt
(74) *Attorney, Agent, or Firm*—Pamela Lau Kee

(57) ABSTRACT

A structure and a method for providing structural stability at an interface between two poorly adhering layers in a semiconductor device involve providing anchoring channels in one of the poorly adhering layers through which the other poorly adhering layer can be anchored to a third layer. Specifically, the structure and method are applicable to a three-layer stack having a top layer of amorphous silicon, a middle layer of titanium nitride, and a bottom layer of oxide. In order to reduce susceptibility to delamination between the amorphous silicon layer and the titanium nitride layer, the anchoring channels are created in the titanium nitride layer to allow the amorphous silicon to attach to the oxide layer. Because the amorphous silicon layer and the oxide layer exhibit good adhesion between each other, delamination between the amorphous silicon layer and the titanium nitride layer is minimized.

16 Claims, 5 Drawing Sheets

METHOD AND STRUCTURE FOR BONDING LAYERS IN A SEMICONDUCTOR DEVICE

TECHNICAL FIELD

The invention relates in general to semiconductor devices, and more particularly to improving adhesion between certain layers that make up semiconductor devices.

BACKGROUND OF THE INVENTION

In the fabrication of semiconductor devices, layers, of dissimilar materials are sequentially formed on top of each other to define a multi-layer structure. In some instances, two electrically conducting layers that are formed in direct contact with each other exhibit poor adhesion. Poor adhesion between layers can have negative consequences, such as bubbling, blistering, and/or peeling at the interface between the two layers. Bubbling, blistering, or peeling degrades the electrical contact between the layers and in turn causes low yield and low reliability in fabricated semiconductor devices. The susceptibility of a device to the negative effects of poor adhesion between layers increases as the area of contact between poorly adhering layers increases.

A specific example of two layers that can exhibit poor adhesion to each other is titanium nitride and amorphous silicon. FIG. 1 is a depiction of a layer stack 10 that includes, from the bottom layer to the top layer, an oxide layer 12, a titanium nitride layer 14, an n-doped amorphous silicon layer 16, an intrinsic amorphous silicon layer 18, and a p-doped silicon layer 20. In the exemplary layer stack, the poor adhesion between the titanium nitride 14 and the n-doped amorphous silicon 16 tends to cause delamination problems when the linear distance of contact between the two layers exceeds approximately 200 $\mu$m in all directions.

One approach to improving adhesion between a titanium layer and a silicon layer in a semiconductor device is disclosed in U.S. Pat. No. 5,783,487 entitled "Method of Coupling Titanium to a Semiconductor Substrate and Semiconductor Device Thereof," issued to Weeks et al. (hereinafter Weeks). The Weeks approach to improving adhesion between a titanium layer and a silicon layer involves forming an oxide layer between the titanium and silicon layers. The oxide layer exhibits good adhesion with both the titanium and the silicon layers. The Weeks approach is also utilized to improve adhesion between metal layers on the back side of a silicon chip. While the approach may work well for its intended purpose, the oxide layer deposited between the titanium and the silicon layers prevents direct contact between the titanium and the silicon layers. Depositing an oxide layer between the amorphous silicon 16 and titanium nitride 14 layers in the layer stack 10 of FIG. 1 negatively affects the electrical characteristics of the layer stack by blocking electrical contact between the amorphous silicon and titanium nitride layers.

In view of the adhesion problems that exist between some layers in semiconductor devices, what is needed is a technique that improves bonding between poorly adhering layers, while maintaining some degree of electrical contact between the layers.

SUMMARY OF THE INVENTION

A method and structure for providing structural stability at an interface between two poorly adhering layers in a semiconductor device involve providing anchoring channels in one of the layers through which the other layer can be anchored to a third layer. Specifically, the structure and method are applicable to a three-layer stack having top and middle layers that tend to exhibit delamination when in direct contact with each other over large areas, and a bottom layer that bonds well to both the middle and top layers. In order to reduce susceptibility to delamination between the top and middle layers while, maintaining direct contact between the top layer and the middle layer, anchoring channels are created in the middle layer to allow the top layer to attach to the bottom layer, in effect tying the top layer down to the bottom layer.

The structure and method are particularly applicable to layer stacks in semiconductor devices, such as active pixel sensors, that include an oxide layer as the bottom layer, a titanium nitride layer as the middle layer, and an amorphous silicon layer as the top layer. In a preferred embodiment, the titanium nitride layer is deposited onto the oxide layer, and anchoring channels are created in the titanium nitride layer in order to expose portions of the oxide layer. The amorphous silicon layer is then deposited over the titanium nitride layer and into the anchoring channels in the titanium nitride layer. The anchoring channels provide direct contact between the amorphous silicon layer and the oxide layer. Although direct contact is provided between the amorphous silicon layer and the oxide layer, the contact between the two layers is not electrically conductive. That is, the anchoring channels are not similar to electrically conducting vias which provide conductive paths between layers. In order to prevent delamination between the titanium nitride layer and the amorphous silicon layer, the anchoring channels are preferably separated by 200 $\mu$m or less.

In another embodiment, the layer of titanium nitride is deposited onto the oxide layer, and portions of the titanium nitride layer are removed such that a pattern of isolated squares, or islands, of titanium nitride is created. Thus, in contrast to the first embodiment in which the patterned titanium nitride is continuous, in this second embodiment, the patterning of the titanium nitride forms isolated islands of the material. Amorphous silicon is then deposited over the titanium nitride islands and onto the exposed oxide layer, thereby anchoring the amorphous silicon layer to the oxide layer. In order to prevent delamination between the titanium nitride layer and the amorphous silicon layer, each of the titanium nitride islands preferably has at least one linear dimension that is less than 500 $\mu$m, preferably less than 200 $\mu$m.

An advantage of the invention is that yield and reliability of semiconductor devices formed with layers of marginal adhesion are improved because delamination is minimized. Moreover, structural stability is enhanced without a loss of electrical connectivity between the layers of the marginal adhesion. In addition, the improved adhesion can be achieved with little extra manufacturing cost.

DETAILED DESCRIPTION

Figure 1:
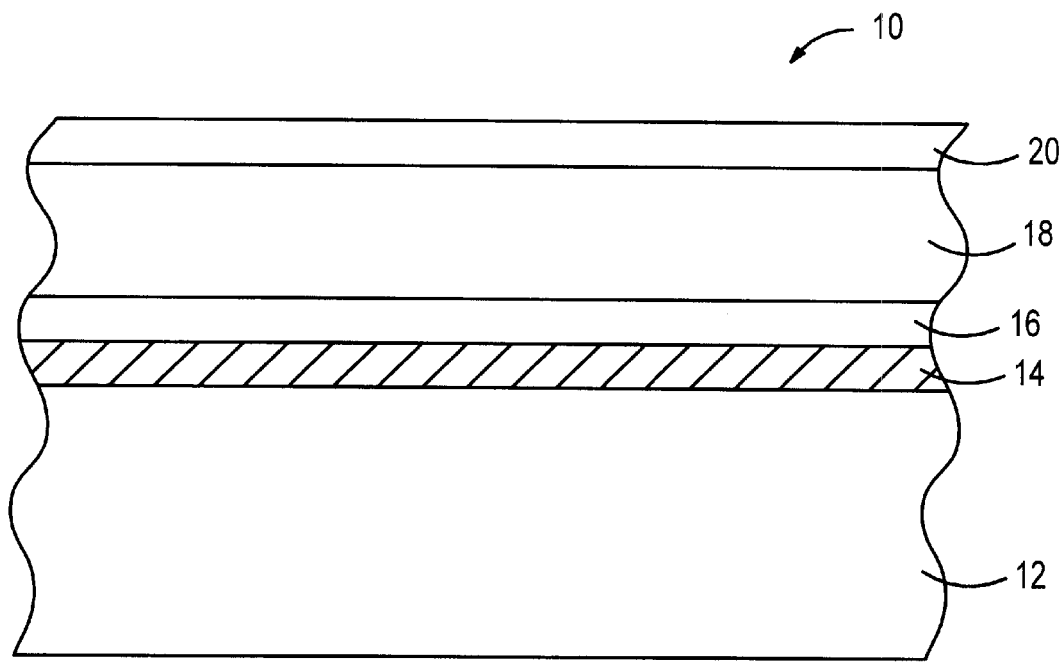
FIG. 1 is a depiction of a layer stack in accordance with the prior art.
Figure 2:
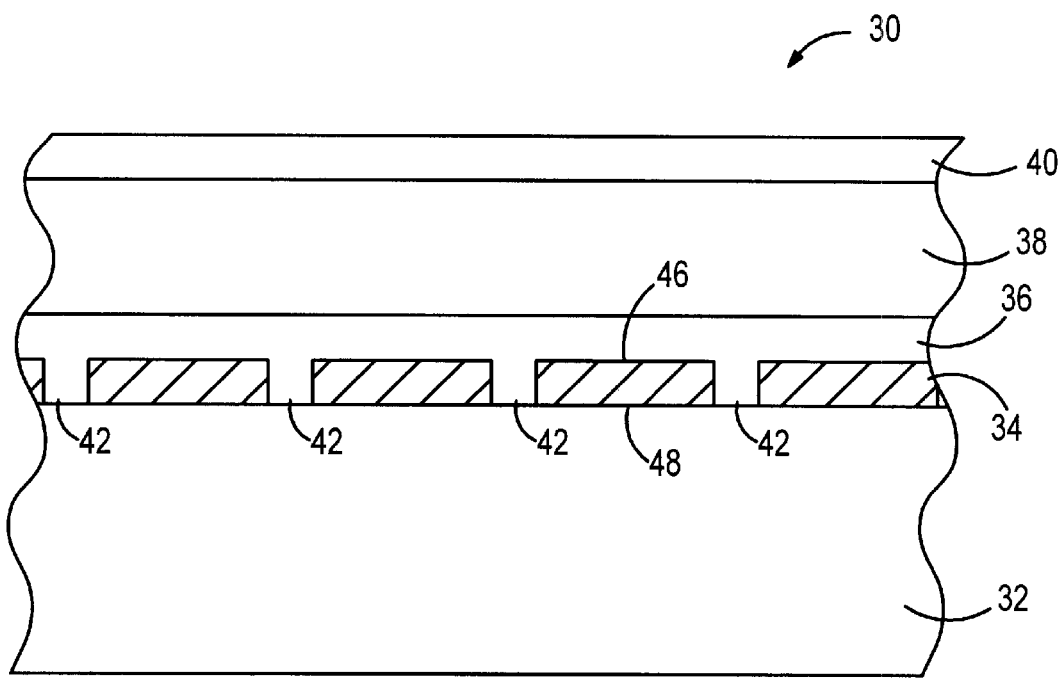
FIG. 2 is a depiction of a preferred layer stack that provides openings through the middle layer in accordance with the invention.

FIG. 2 is a depiction of a preferred layer stack 30 that improves adhesion between two poorly adhering layers. The layer stack includes, from the bottom layer to the top layer, an oxide layer 32, a titanium nitride layer 34, an n-doped amorphous silicon layer 36, an intrinsic (not doped) amorphous silicon layer 38, and a p-doped silicon layer 40. As described with reference to FIG. 1, adhesion between the amorphous silicon layer 36 and the titanium nitride layer 34 is inherently poor, and the resulting poor bonding strength tends to cause problems with yield and reliability, especially when contact between the two layers exceeds approximately 200 $\mu$m in all directions. On the other hand, the titanium nitride layer 34 exhibits good adhesion to the oxide layer 32 and amorphous silicon bonds well to oxide.

In order to improve adhesion between the amorphous silicon layer 36 and the titanium nitride layer 34, openings 42 are formed through the titanium nitride layer to provide anchor points between the two layers. The openings act as anchoring channels, allowing the amorphous silicon to bond directly to the oxide layer 32. Because the amorphous silicon layer adheres well to the oxide layer, delamination at the interface 46 between the amorphous silicon and the titanium nitride is minimized. In the prior art layer stack of FIG. 1, the amorphous silicon layer 16 is completely separated from the oxide layer 12 by the titanium nitride layer 14, which leads to the delamination problems, as stated above. Although one example of an anchoring pattern is shown in FIG. 2, there are many variations of patterns and shapes that can be implemented to provide direct contact between the amorphous silicon layer and the oxide layer, while areas of direct interface 48 between the titanium nitride and the oxide layers are maintained.

Creating the structure of FIG. 2 involves first depositing a layer of titanium nitride 34 onto the oxide layer 32, with the oxide layer being formed on a substrate of silicon, for example. In a preferred embodiment, the thickness of the oxide layer ranges from approximately 300 Å to 2 $\mu$m, and the thickness of the titanium nitride layer ranges from approximately 100 to 2,000 Å. After deposition, portions of the titanium nitride layer are removed to create the openings 42, or anchoring channels, in the titanium nitride layer. The openings must pass completely through the titanium nitride layer in order to provide improved adhesion. Preferably, the openings in the titanium nitride layer are created utilizing known photolithographic and etching techniques.

After the desired pattern of titanium nitride is removed, the amorphous silicon layer 36 is deposited onto the remaining titanium nitride layer 34 and into the openings 42 formed within the titanium nitride layer. The amorphous silicon is deposited at a preferred thickness that ranges from approximately 200 to 30,000 Å. The amorphous silicon forms a strong bond with the oxide layer 32 at the interface 48 points within the openings. Allowing direct contact between the amorphous silicon layer and the oxide layer, and limiting the area of continuous interface 46 between the amorphous silicon and titanium nitride layers improves adhesion and reduces the problems of bubbling, blistering, peeling, etc. The subsequent layers of the layer stack are deposited, as needed, to create the desired integrated circuit components, such as transistors, capacitors, resistors, and diodes.

Figure 3:
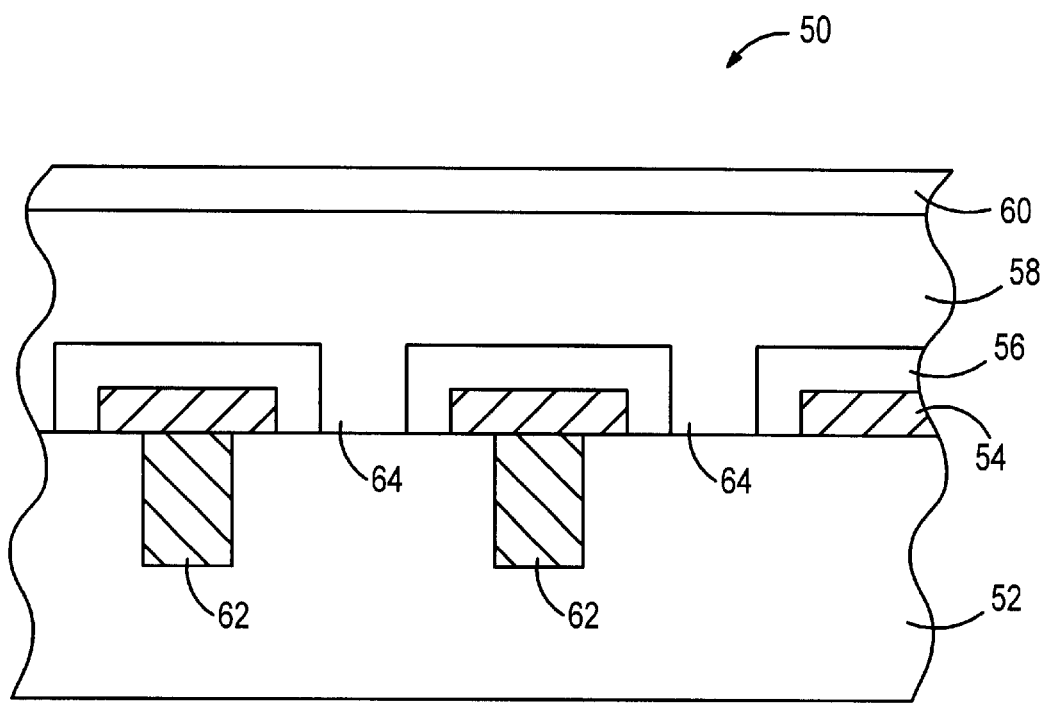
FIG. 3 is a depiction of another layer stack that provides openings through the middle layer in accordance with the invention.

FIG. 3 is a depiction of another preferred layer stack 50 that improves adhesion between two poorly adhering layers. The layer stack includes, from the bottom layer to the top layer, an oxide layer 52, a titanium nitride layer 54, an n-doped amorphous silicon layer 56, an intrinsic amorphous silicon layer 58, and a p-doped silicon layer 60. The layer stack also includes metal vias 62, or plugs, that form parts of devices such as transistors, capacitors, resistors, etc. Although the metal vias are only shown in FIG. 3, metal vias can also be present in the layer stack 30 of FIG. 2. In contrast to the embodiment of FIG. 2, the embodiment of FIG. 3 includes a discontinuous amorphous silicon layer 56 that is in contact with both the titanium nitride layer 54 and the oxide layer 52. Although the amorphous silicon does not entirely fill the openings 64 in the titanium nitride layer, there is sufficient surface contact of the amorphous silicon with the oxide layer that delamination between the amorphous silicon and the titanium nitride is prevented. In the embodiment of FIG. 3, the amorphous silicon layer is formed into a discontinuous layer in order to achieve particular device characteristics.

Creating the structure of FIG. 3 involves first etching via holes into the oxide layer 52, and then depositing the metal, for example tungsten, into the via holes. Next, the titanium nitride layer 54 is deposited on top of the oxide layer and the metal vias 62. Portions of the titanium nitride layer are then removed to create a pattern of openings 64 that pass completely through the layer. After the desired pattern of openings is formed in the titanium nitride layer, the amorphous silicon layer 56 is deposited onto the remainder of the titanium nitride layer and into the openings formed within the titanium nitride layer. Portions of the amorphous silicon are then removed to create the structure of FIG. 3. The subsequent layers (amorphous silicon layer 58 and p-doped silicon layer 60) are deposited as needed to create the desired device. As with the structure of FIG. 2, layer deposition and removal is accomplished using known semiconductor fabrication techniques.

Figure 4A:
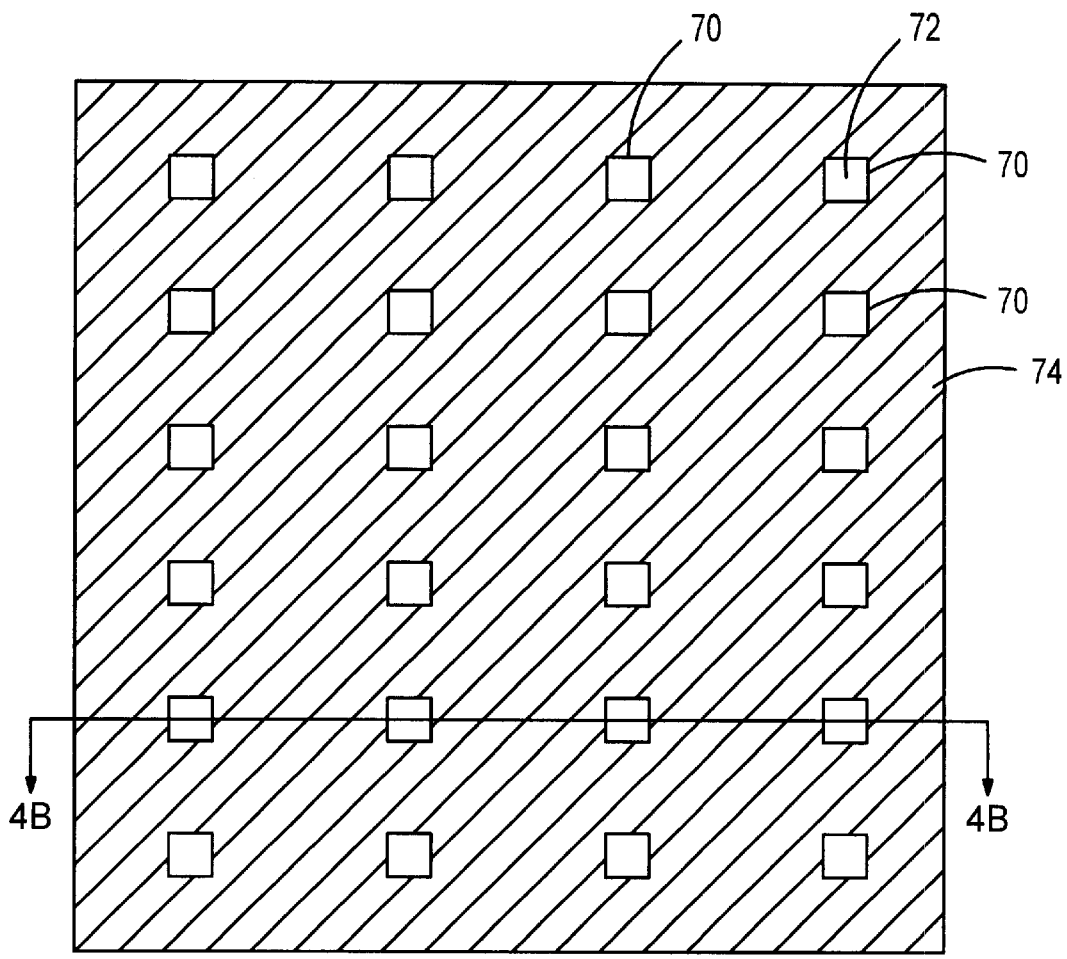
FIG. 4A is a top view of a layer stack that provides openings in the middle layer in accordance with the invention.
Figure 4B:
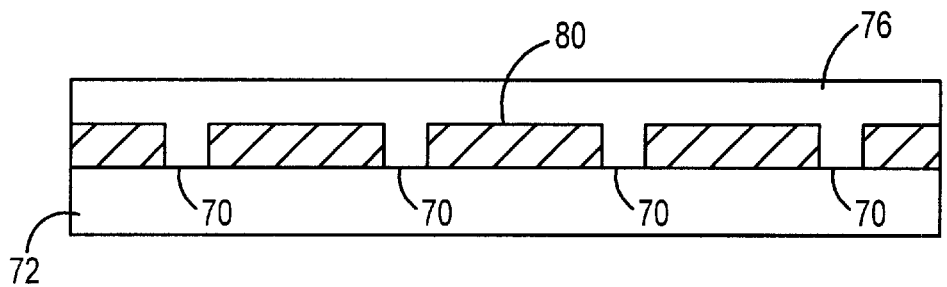
FIG. 4B is a sectional view of the layer stack of FIG. 4A showing the openings in the middle layer in accordance with the invention.

FIGS. 4A and 4B are top and sectional views of one embodiment of a layer stack that improves adhesion between an amorphous silicon layer and a titanium nitride layer. Referring to FIG. 4A, a layer of titanium nitride 74 is deposited onto the oxide layer 72, and then a repeating pattern of openings 70 is created in the titanium nitride layer in order to expose the oxide layer. The exposed oxide layer allows contact to be made between the amorphous silicon layer and the oxide layer. The amorphous silicon layer is then deposited over the titanium nitride layer and into the openings to create the desired layer stack.

FIG. 4B is a sectional view of FIG. 4A, taken along line 4B—4B. The openings 70 in the titanium nitride layer 74 provide direct contact between the amorphous silicon layer 76 and the oxide layer 72. The openings shown in FIGS. 4A and 4B should be sufficiently large (preferably 1–10 $\mu$m) to enable good step coverage and provide good adhesion between the amorphous silicon and the oxide, and the distance between openings should be small enough to prevent delamination at the interface 80 of the amorphous silicon and the titanium nitride layers. In an embodiment, the linear distance between openings in the titanium nitride layer is less than 500 $\mu$m in at least one linear direction, preferably less than 200 $\mu$m in at least one linear direction. That is, there should be no point on the titanium nitride layer that is greater than 250 μm from an anchoring channel, and preferably no greater than 100 μm from at least one anchoring channel.

Figure 5A:
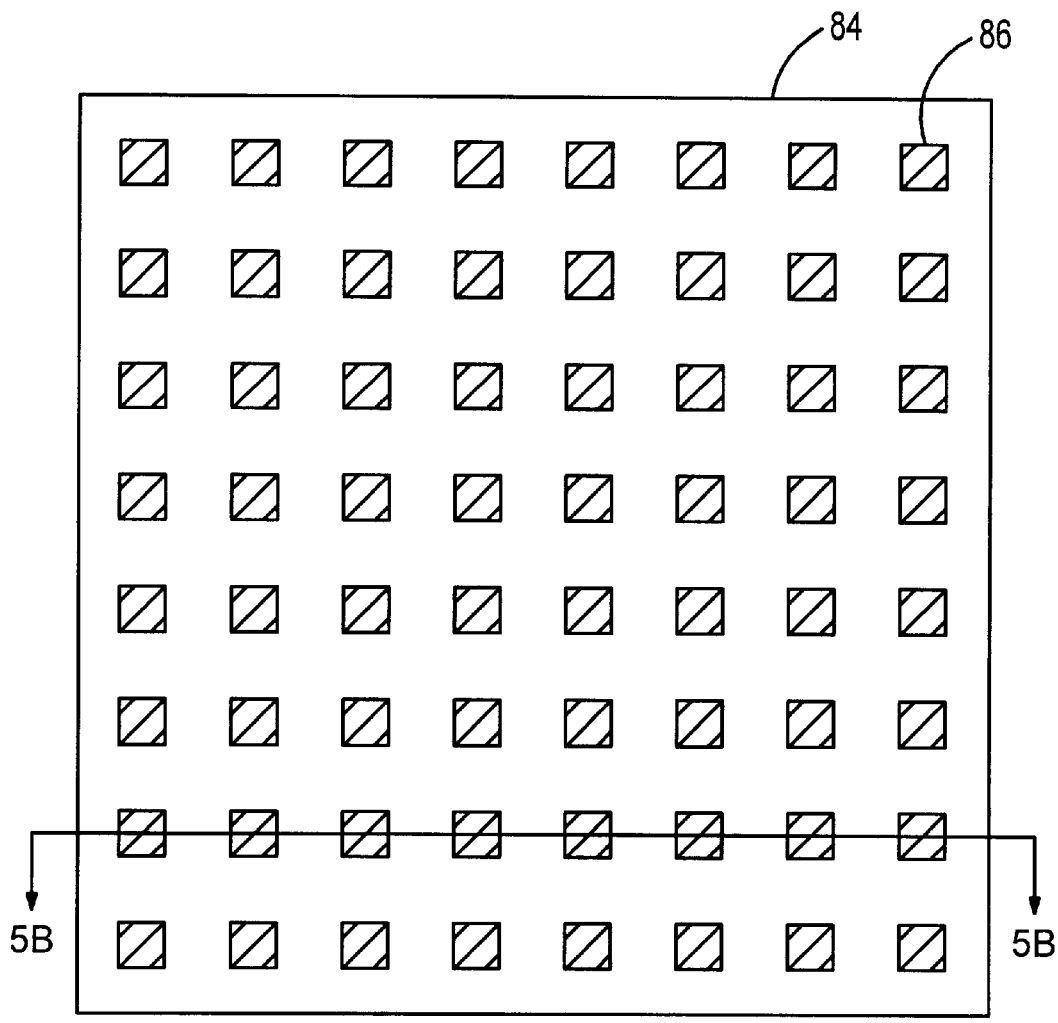
FIG. 5A is a top view of another layer stack that includes isolated squares of the middle layer in accordance with the invention.
Figure 5B:
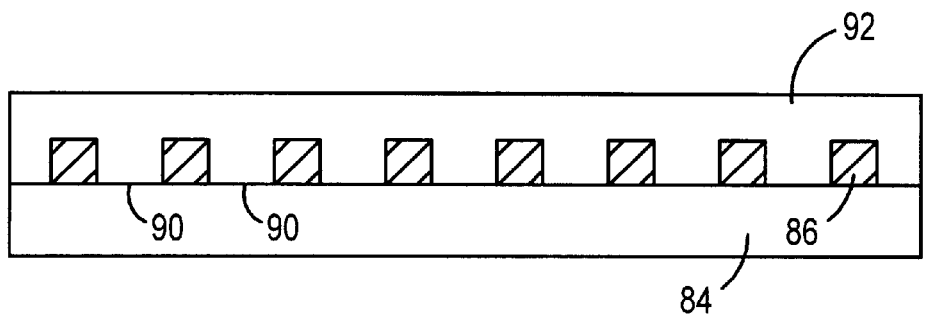
FIG. 5B is a sectional view of the layer stack of FIG. 5A that shows the isolated squares of the middle layer in accordance with the invention.

FIGS. 5A and 5B are top and sectional views of another embodiment of the layer stack that improves adhesion between the amorphous silicon layer and the titanium nitride layer. Referring to FIG. 5A, a layer of titanium nitride 86 is deposited onto the oxide layer 84 and then portions of the titanium nitride layer are removed such that a repeating pattern of isolated squares, or islands, of titanium nitride is created. The amorphous silicon is deposited over the titanium nitride islands and onto the exposed oxide layer to create the desired layer stack.

FIG. 5B is a sectional view of FIG. 5A, taken along line 5B—5B. The exposed areas 90 of oxide provide direct contact between the amorphous silicon layer 92 and the oxide layer 84. The titanium nitride islands of FIG. 5A and 5B should have dimensions that are no larger than the minimum dimensions that cause delamination between the amorphous silicon and the titanium nitride. Preferably, the islands have at least one linear dimension that is less than 500 μm, more preferably less than 200 μm. Although square islands and square openings 78 and 90 are shown in FIGS. 4A and 5A, other shaped openings and/or islands are possible. In addition to the described patterns, other opening patterns, including non-repeating patterns can be utilized to provide anchoring between the amorphous silicon layer and the oxide layer.

In variations of the preferred embodiments, the titanium nitride layer may also be a titanium layer or a combination titanium nitride/titanium layer. Other metals, including aluminum, copper, and/or tungsten, are possible. The oxide layer is preferably silicon dioxide although other dielectric layers such as silicon nitride are possible.

Figure 6:
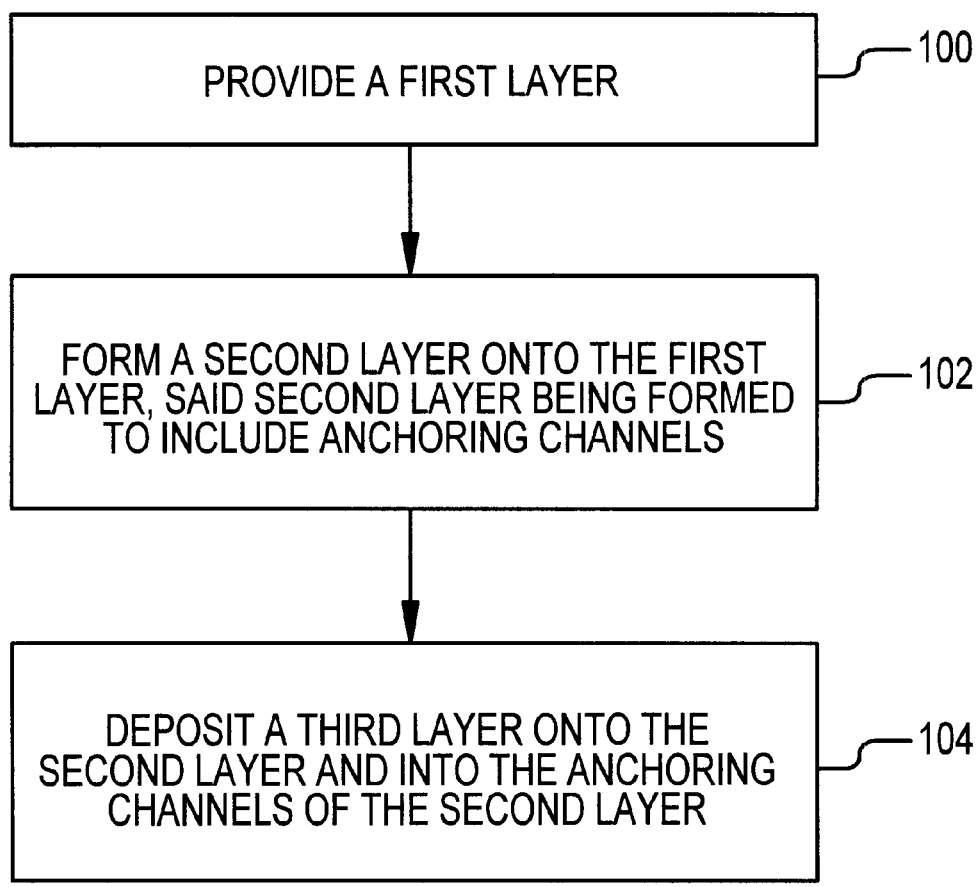
FIG. 6 is a process flow for creating a layer stack having improved adhesion.

FIG. 6 is a process flow diagram of a preferred method for fabricating a layer stack that provides improved adhesion between layers. In a step 100, a first layer is provided. In a step 102, a second layer is formed on the first layer with the second layer including anchoring channels formed completely through the second layer. In a step 104, a third layer is deposited on the second layer and into the anchoring channels within the second layer, such that the third layer bonds to the first layer, thereby providing good structural stability in joining the first, second and third layers.

Although the preferred layer stacks include oxide, titanium nitride, and amorphous silicon, the approach of providing openings in a middle layer to improve adhesion between two layers applies equally to other three-layer stacks. Specifically, the approach can be applied to three-layer stacks in which two layers that exhibit poor adhesion to each other must be attached to a third layer that exhibits good adhesion to both of the other two layers.

What is claimed is:

1. A semiconductor device fabrication method for bonding second and third layers formed of materials having weak adhesion characteristics with respect to each other, said method comprising the steps of:

selecting dissimilar materials for forming said second and third layers on a basis of achieving target electrical interaction during operation of finally fabricated circuitry;

providing a first layer, including selecting an electrically non-conductive material on a basis of providing said first layer with properties which achieve relatively strong adhesion when in contact with either said second layer or said third layer;

forming said second layer on said first layer, said second layer having a first surface in contact with said first layer and having a second surface opposite said first surface, said second layer being formed to include anchoring channels that pass from said first surface of said second layer to said first layer, said second layer being electrically conductive; and depositing said third layer on said second surface of said second layer and into said anchoring channels within said second layer such that said third layer bonds to said first layer, thereby providing structural stability in joining said first, second and third layers.

2. The method of claim 1 wherein said step of depositing includes a step of creating an electrically non-conductive bond between said first layer and said third layer.

3. The method of claim 2 wherein:

said step of providing said first layer includes a step of depositing an oxide layer;

said step of forming said second layer includes a step of depositing a titanium nitride layer; and said step of depositing said third layer includes a step of depositing an amorphous silicon layer.

4. The method of claim 2 wherein said step of forming anchoring channels within said second layer includes a step of etching anchoring channels into said second layer, said anchoring channels being completely surrounded by a continuous portion of said second layer.

5. The method of claim 4 wherein no point on said second layer is greater than 250 μm from at least one of said anchoring channels.

6. The method of claim 5 wherein:

said step of providing said first layer includes a step of depositing an oxide layer;

said step of forming said second layer includes a step of depositing a titanium nitride layer; and said step of depositing said third layer includes a step of depositing an amorphous silicon layer.

7. The method of claim 2 wherein said step of forming anchoring channels within said second layer includes a step of etching continuous areas within said second layer to create a plurality of spaced apart second layer islands.

8. The method of claim 7 wherein no point on said second layer islands is greater than 250 μm from at least one of said anchoring channels.

9. The method of claim 8 wherein:

said step of providing said first layer includes a step of depositing an oxide layer;

said step of forming said second layer includes a step of depositing a titanium nitride layer; and said step of depositing said third layer includes a step of depositing an amorphous silicon layer.

10. A semiconductor device fabrication method for bonding an amorphous silicon layer to a titanium nitride layer, said amorphous silicon layer and said titanium nitride layer having relatively weak bonding characteristics with respect to each other, said method comprising the steps of:

providing an oxide layer which has relatively strong bonding characteristics with respect to amorphous silicon and titanium nitride, said oxide layer being electrically non-conductive;

forming said titanium nitride layer onto said oxide layer, including forming anchoring channels within said titanium nitride layer, said anchoring channels exposing portions of said oxide layer for bonding with said amorphous silicon layer; and depositing said amorphous silicon layer onto said titanium nitride layer and into said anchoring channels in order to provide structural stability at the interface of said titanium nitride layer and said amorphous silicon layer, said amorphous silicon layer forming relatively strong bonds with said exposed portions of said oxide layer, said relatively strong bonds between sand amorphous silicon layer and said oxide layer being electrically non-conductive.

11. The method of claim 10 wherein said step of forming said titanium nitride layer includes a step of limiting the distance between said anchoring channels to 200 $\mu$m or less in at least one linear direction.

12. The method of claim 10 wherein said step of forming anchoring channels within said titanium nitride layer includes a step of etching continuous areas within said titanium nitride layer to create a plurality of titanium nitride layer islands.

13. The method of claim 12 wherein each one of said titanium nitride islands is no more than 200 $\mu$m in at least one linear direction.

14. A semiconductor device fabrication method for bonding second and third layers formed of materials having weak adhesion characteristics with respect to each other, said method comprising the steps of:

providing a first layer on a semiconductor substrate, said first layer being electrically non-conductive, said first layer having properties which provide relatively strong adhesion when in contact with either said second layer or said third layer;

forming said second layer on said first layer, said second layer having a first surface in contact with said first layer and having a second surface opposite said first surface, said second layer being formed to include anchoring channels that pass from said first surface of said second layer to said first layer, said second layer being electrically conductive; and in the absence of electrical connection to said second layer, depositing said third layer on said second surface of said second layer and into said anchoring channels within said second layer such that said third layer bonds to said first layer, thereby providing structural stability in joining said first, second and third layers.

15. The method of claim 14 wherein said step of depositing includes a step of creating an electrically non-conductive bond between said first layer and said third layer.

16. The method of claim 15 wherein said step of forming anchoring channels within said second layer includes a step of etching anchoring channels into said second layer, said anchoring channels being completely surrounded by a continuous portion of said second layer.

* * * * *